United States Patent [19]
Collings et al.

[11] Patent Number: 5,329,994
[45] Date of Patent: Jul. 19, 1994

[54] JET IMPINGEMENT HEAT EXCHANGER

[75] Inventors: Roger J. Collings, Rockford, Ill.; Michael P. Ciacco, Canton, Mich.

[73] Assignee: Sundstrand Corporation, Rockford, Ill.

[21] Appl. No.: 993,864

[22] Filed: Dec. 23, 1992

[51] Int. Cl.⁵ .................................... F28F 13/12
[52] U.S. Cl. .............................. 165/109.1; 165/170
[58] Field of Search .............. 165/109.1, 170, 908

[56] References Cited

U.S. PATENT DOCUMENTS

| | | | |
|---|---|---|---|
| 4,108,242 | 8/1978 | Searight et al. | 165/164 |
| 4,494,171 | 1/1985 | Bland et al. | 361/386 |
| 4,573,865 | 3/1986 | Hsia et al. | 415/115 |
| 4,643,250 | 2/1987 | Niggemann et al. | 165/159 |
| 4,645,001 | 2/1987 | Hillerström | 165/159 |
| 4,700,774 | 10/1987 | Schwarz | 165/140 |
| 4,880,055 | 11/1989 | Niggemann et al. | 165/167 |
| 5,056,586 | 10/1991 | Bemisderfer | 165/1 |
| 5,062,474 | 11/1991 | Joshi | 165/109.1 |
| 5,228,513 | 7/1993 | Hemsath | 165/154 |

FOREIGN PATENT DOCUMENTS

| | | | |
|---|---|---|---|
| 2413250 | 10/1975 | Fed. Rep. of Germany | 165/154 |
| 301497 | 4/1971 | U.S.S.R. | 165/908 |
| 769294 | 10/1980 | U.S.S.R. | 165/908 |
| 89-01599 | 2/1989 | World Int. Prop. O. | 165/908 |

Primary Examiner—Allen J. Flanigan
Attorney, Agent, or Firm—Antonelli, Terry, Stout & Kraus

[57] ABSTRACT

A heat exchanger (10) in accordance with the invention includes first and second heat conductive, spaced apart plates (12 and 14) and a heat conductive sheet (16) disposed between the plates and having repeating ridges (18) in thermal contact with the plates with successive ridges facing a different one of the plates and sections (22) of the sheet between successive ridges being inclined with respect to the axis of fluid flow and containing at least one aperture (32, 34 and 38) extending between the opposed surfaces of the section for passing fluid flow through the at least one aperture when fluid flows along the axis of fluid flow with fluid flow through the at least one aperture of the plurality of sections producing jets of fluid contacting one of the plates.

27 Claims, 2 Drawing Sheets

JET IMPINGEMENT HEAT EXCHANGER

TECHNICAL FIELD

The present invention relates to jet impingement heat exchangers in which heat exchange occurs between jets of fluid and the surface contacted by the jets.

BACKGROUND ART

High performance heat exchangers known as compact high intensity coolers (CHIC) provide high capacity cooling with heat flux capabilities in excess of 100 watts per square centimeter at 0.15° C. per watt. These CHICs are difficult and expensive to manufacture and are not subject to mass reproduction.

The Assignee of the present invention has developed CHIC coolers using jet impingement cooling. These jet impingement heat exchangers utilize a series of plates which are fabricated with apertures which create jets of fluid passing through the apertures which impinge upon subsequent solid surface areas of other plates to provide jet impingement cooling. A core of this type of jet impingement CHIC type heat exchanger is made by forming a series of plates into a fluid-tight structure which, when coupled to suitable manifolding, provides a tortuous path of fluid flow from an inlet manifold to an outlet manifold through the core with jets of fluid being created by passage through various apertures within the plates within the core. Representative samples of jet impingement CHIC type heat exchangers developed by the Assignee of the present invention are disclosed in U.S. Pat. Nos. 4,880,055 and 4,494,171. The Assignee has developed additional heat exchangers which are fabricated from plates which are formed into a core with the plates forming jets to produce jet impingement cooling. Furthermore, high performance CHICs of this type require orifice diameters in the apertures of the plates which vary between 0.005 to 0.015 inches which require expensive manufacturing processes in order to provide uniformity of diameter. Variation in the diameter in the orifices affects the overall cooling performance. Finally, assuming that the orifices may be fabricated within the aforementioned dimensional range, in practice, the working fluid flowing through the core must be extremely clean and filtered to remove particulate debris which can plug the orifices.

Most electronic devices require a heat dissipation capability less than the aforementioned 100 W/cm$^2$ at 0.15° C. per watt with a range of 30–50 W/cm$^2$ at 0.15° C. being a typical heat dissipation capability to maintain performance of electronic devices. A need exists for a mass reproducible, inexpensive jet impingement CHIC having a heat dissipation capability less than the high performance CHICs which are formed from plates fabricated into a core which have the aforementioned difficulties of expense and complex manufacturing processes.

DISCLOSURE OF INVENTION

The present invention is a heat exchanger utilizing jet impingement heat exchange between a surface upon which jets of fluid impinge and the fluid within the jets which is inexpensive to manufacture and has a heat exchange capability sufficient to cool electronic devices or other devices requiring intermediate levels of heat exchange.

With the invention, a heat exchanger may be fabricated with first and second heat conductive spaced apart plates between which and in thermal contact is a heat conductive sheet having repeating ridges (fins) of the heat exchanger in thermal contact with the plates. Successive ridges face a different one of the first and second plates. Sections of the sheet between successive ridges are inclined with respect to the axis of fluid flow. At least one aperture extends between opposed surfaces of the section for passing fluid flow along the axis of fluid flow with fluid flow through the at least one aperture of a plurality of the sections producing jets of fluid flow contacting one of the plates.

The ridges (fins) are formed by metal working of the sheet so that first and second sections meet at the ridge. One of the first and second sections contains at least one aperture which produces a jet of fluid which contacts one of the first and second plates and the other of the sections contains at least one aperture through which fluid flows resulting from the impingement of the jets on the one plate toward another one of the sections. The jets may be produced by a plurality of apertures and the fluid flow through the other of the sections to the one section may be produced by a single aperture having a cross-sectional area larger than a cross-sectional area of one of the plurality of the apertures in the one section or, alternatively, by a plurality of apertures. An angle measured between the section creating the jets of fluid impinging upon one of the plates and the axis of fluid flow is less than an angle measured between the other section and the axis of fluid flow.

In accordance with the invention, the direction of fluid flow through the heat exchanger may be changed to select the one of the first and second plates which produces the highest rate of heat exchange during flow through the heat exchanger. Suitable manifolding and a pump permits fluid to be forced along the axis of flow through the heat exchanger in either a first direction or a second direction opposite to the first direction. Moreover, the fluid may be either a gas or a liquid.

A heat exchanger in accordance with the invention includes first and second heat conductive, spaced apart plates; and a heat conductive sheet disposed between the plates and having repeating ridges in thermal contact with the plates with successive ridges facing a different one of the plates and sections of the sheet between successive ridges being inclined with respect to the axis of fluid flow and containing at least one aperture with the at least one aperture extending between opposed surfaces of the sections for passing fluid flow through the at least one aperture when fluid flows along the axis of fluid flow with fluid flow through the at least one aperture of a plurality of the sections producing jets of fluid contacting one of the plates, first and second sections forming a ridge facing the first plate with a first section having at least one aperture through which fluid flows and is directed in at least one jet to contact the first plate which is to be thermally coupled to a heat source for transmitting heat flowing from the heat source to the first plate to the flowing fluid and the second section having at least one aperture through which fluid flows to another first section and is directed to flow toward the another first section with the first plate during fluid flow having a higher heat dissipation capability than the second plate. The first and second sections may contain a plurality of apertures or, alternatively, the second section may contain a single aperture having a cross-sectional area larger than a cross-sectional area of individual apertures in the first section.

The single aperture may be rectangular in cross section and have a longitudinal dimension perpendicular to the axis of fluid flow. An angle measured between the first section and the axis of fluid flow is less than an angle measured between the second section and the axis of fluid flow. The second section and the another first section form a ridge facing the second plate. The sheet may be metallic and corrugated and the plates may be metallic.

A heat exchanger in accordance with the invention includes first and second heat conductive spaced apart plates with one of the plates being selectible to exchange more heat than the other of the plates by choosing a direction of fluid flow through the heat exchanger; a heat conductive sheet disposed between the plates and having repeating ridges in thermal contact with the plates and with successive ridges facing a different one of the plates and sections of the sheet between successive ridges being inclined with respect to the axis of fluid flow and containing at least one aperture with the at least one aperture extending between opposed surfaces of the sections for passing fluid flow through the at least one aperture when the fluid flow is along the axis of fluid flow with fluid flow through the at least one aperture of the plurality of sections producing jets of fluid contacting one of the plates; and a flow control for controlling the direction of fluid flow along the fluid flow axis in a first direction or a second direction opposite to the first direction to select which of the first and second plate exchanges more heat with the fluid. The first and second sections form a ridge facing one of the plates with the first section having at least one aperture through which fluid flows and is directed in a jet to contact one plate and the second section having at least one aperture through which fluid flows to another first section and is directed to flow toward the another first section. The first section may contain a plurality of apertures and the second section may contain a single aperture having a cross-sectional area larger than a cross-sectional area of individual apertures in the first section or, alternatively, the second section contains a plurality of apertures. The single aperture may be rectangular in cross section and have a longitudinal dimension perpendicular to the axis of fluid flow. An angle measured between the first section and the axis of fluid flow is less than an angle measured between the second section and the axis of fluid flow. The second section and the another first section form a ridge facing the second plate. The sheet may be metallic and corrugated and the plates may be metallic.

BEST MODE FOR CARRYING OUT THE INVENTION

Figure 1:
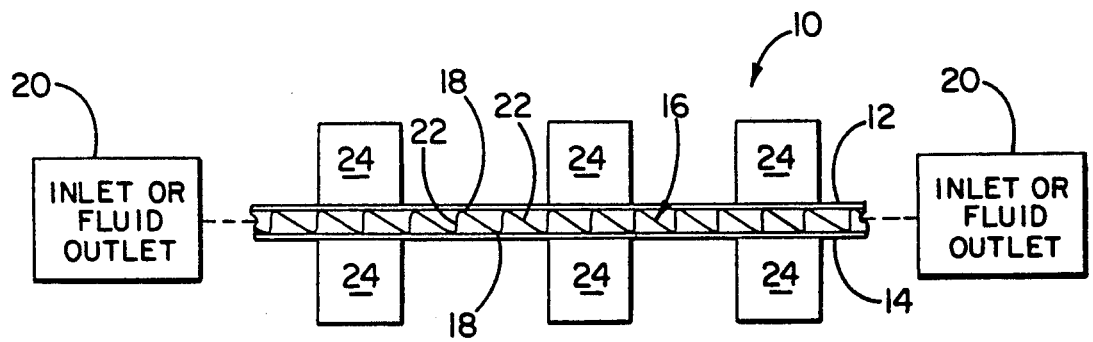
FIG. 1 illustrates a view of a heat exchanger in accordance with the invention which is formed into a core having a sheet containing repeated ridges in thermal contact with spaced apart plates of the core of the heat exchanger.
Figure 4:
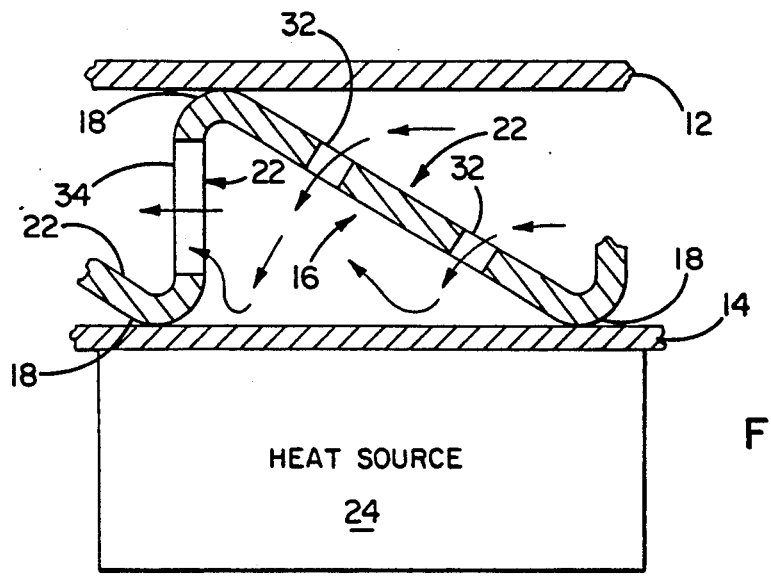
FIG. 4 illustrates an enlarged view of a section of the heat exchanger of FIG. 1 with fluid flowing in a first direction along the axis of fluid flow through the heat exchanger core.
Figure 5:
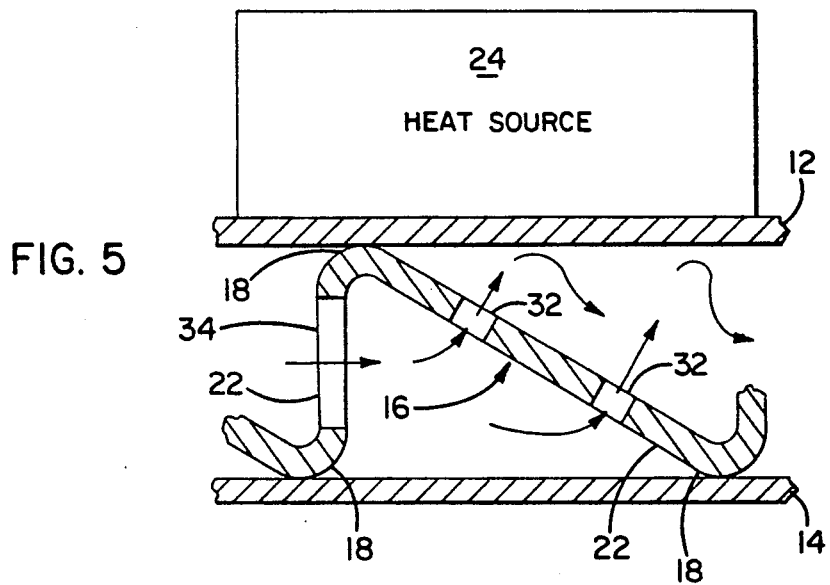
FIG. 5 illustrates an enlarged view of a section of the heat exchanger of FIG. 1 with fluid flowing in a second direction opposite to the direction of fluid flow illustrated in FIG. 4 along the axis of fluid flow through the heat exchanger core.
Figure 6:
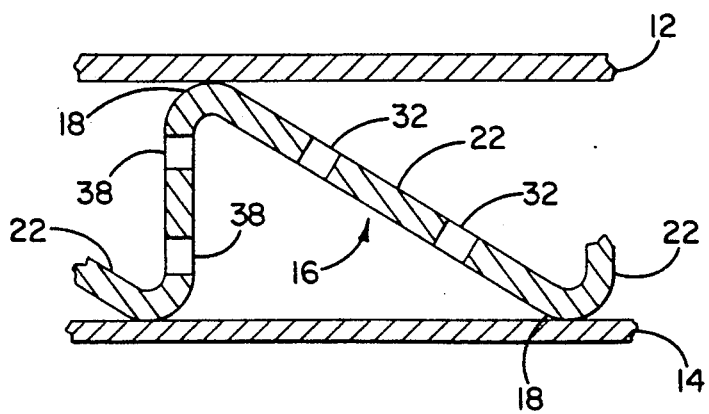
FIG. 6 illustrates a section of an alternative embodiment of the heat exchanger having the configuration of apertures in the corrugated sheet from the section in the bottom of FIG. 2.

FIG. 1 illustrates a section of a heat exchanger 10 in accordance with the present invention. Like reference numerals identify like parts throughout the drawings. The heat exchanger is formed from first and second heat conductive spaced apart plates 12 and 14 which preferably are made from a highly heat conductive material such as copper or aluminum. A pair of side walls (not illustrated) form fluid-tight seals with the plates 12 and 14 and corrugated heat conductive sheet 16 to confine the fluid flow along a fluid flow axis between the pair of inlet or outlets 20 disposed at the ends of the fluid flow axis. The corrugated heat conductive sheet 16 is disposed between and in thermal contact with the plates 12 and 14 and the side walls. The sheet 16 has a repeating series of ridges (fins) 18 spaced apart in a direction parallel to the axis of fluid flow which extends in the direction between the inlet and fluid outlets 20 between which fluid flows. Each ridge 18 has an axis which is orthogonal to the axis of fluid flow and extends into and out of a plane of the FIG. 1. The inlet or outlets 20 contain a pump or other fluid handling device to provide pressure for causing the fluid to flow from an inlet through the heat exchanger core to the outlet. The width of the ridges extends perpendicular into and out of the plane of FIG. 1. Individual channels containing the fluid flow axis contain apertures between the ridges 18 illustrated in FIGS. 4–6. Successive ridges 18 face and preferably are joined to a different one of the first and second plates 12 and 14 when moving along the fluid flow axis. Sections 22, which are disposed between adjacent or successive ridges 18, are inclined with respect to the axis of fluid flow between the inlet or fluid outlets 20. Each section 22 contains at least one aperture as illustrated in FIGS. 4–6 discussed below. The at least one aperture extends between opposed surfaces of the section 22 for passing fluid flow through the at least one aperture when fluid flows along the axis of fluid flow. Fluid flows through at least one aperture of a plurality of the sections 22 producing jets of fluid which contact one of the plates 12 and 14. As will be described in detail below with respect to FIGS. 4 and 5, the direction of fluid flow between the inlet or fluid outlets 20 (left to right or right to left) determines whether the jets strike the plate 14 as illustrated in FIG. 4 or the plate 12 as illustrated in FIG. 5. A plurality of heat loads 24 are in contact with at least one of the plates 12 and 14. The heat loads may be disposed in surface contact with one or both of the plates 12 and 14. The direction of fluid flow along the axis of fluid flow either from right to left or left to right (FIG. 5) respectively causes the plate 12 and the plate 14 to have a higher rate of heat dissipation than the other plate as a consequence of the jets of fluid defined by the at least one aperture in the sections 22 impinging upon the plates as illustrated in FIGS. 4 and 5. The heat sources 24 which are being cooled to a greater degree by thermal contact with the one of the first and second plates 12 and 14 is determined by the direction of fluid flow along the fluid flow axis.

Figure 2:
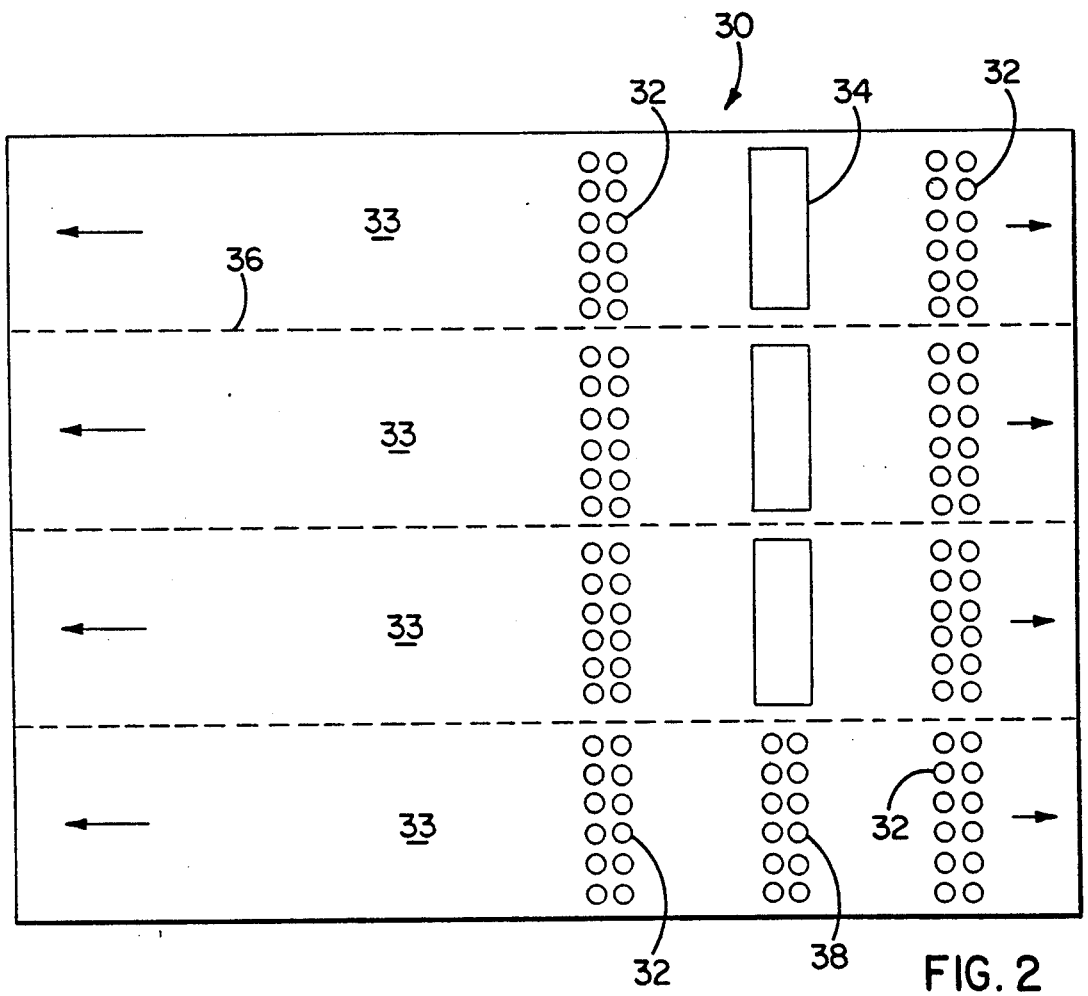
FIG. 2 illustrates a sheet containing different types of fluid flow apertures prior to deformation into repeating ridges as illustrated in FIG. 1.
Figure 3:
FIG. 3 illustrates an end view of the sheet of FIG. 1.

FIGS. 2 and 3 illustrate respectively a top plan and side view of a metallic heat conductive sheet which is formed into the corrugated sheet 16 by a conventional metal forming process after formation of apertures but prior to cutting along dotted lines 36. The sheet 30 is punched to produce either a repeating sequence of a plurality of apertures 32 and single aperture 34 having a cross-sectional area greater than the individual apertures 32 which repeat completely across the length and width of the sheet 30 as illustrated in the top three horizontally extending sections 33 or, alternatively, a repeating sequence of a plurality of apertures 32 and a plurality of apertures 38 which repeat completely across the length and width of the sheet which are bounded by the dotted lines 36 which represent cut lines to be made by conventional metal cutting processes. The repeating groups of apertures 32 and 38 and single aperture 34 have not been illustrated completely across the length of the channel for the purpose of simplifying the illustration but it should be understood that the apertures in practice repeat at uniform spacing across the full length of the sections 33. For purposes of illustration only a pair of groups of apertures 32 and a single aperture 34 has been illustrated in the top three channels 33 and a pair of groups of apertures 32 and a single group of apertures 38 has been illustrated in the bottom channel 33. The apertures 32 and 34 may be punched out with conventional metal forming processes. It should be noted that in an application of the present invention the apertures 32 and 34 may repeat in intervals of two-tenths of an inch prior to metal forming into the corrugated sheet 16 as illustrated in FIG. 1. The bottom horizontal section 33 illustrates an alternative embodiment of the apertures in which the rectangular aperture 34 of the top three sections 33 is replaced with a plurality of apertures 38 formed by the same processing used to form the apertures 32. The cross-sectional area of the rectangular aperture 34, which has a cross-sectional area larger than the combined cross-sectional area of the plurality of apertures 32, produces less flow resistance through the core of the heat exchanger than the apertures 32 and 38. As a result, the heat exchange rate between the jets of fluid created by the apertures 32 of the top three sections 33 is higher than the heat exchange rate between the jets of fluid created by the apertures 32 of the bottom section. The longitudinal dimension of the aperture 34 is perpendicular to the axis of fluid flow through the core. The possible directions of fluid flow along the axis of fluid flow through the heat exchanger core of FIGS. 1 and 4–6 is indicated in FIG. 2 by the bidirectional arrows.

The fabrication of the sheet 16 of the heat exchanger core in accordance with the invention involves the punching of the apertures 32, 34 and 38 followed by deforming the sheet 30 to produce the corrugated configuration illustrated in FIGS. 1 and 4–6 having a repeating sequence of ridges or fins 18 extending at regular intervals along the fluid flow axis. The deformation of the sheet 30 to produce the corrugated configuration may be done by any conventional process involving dies, etc. Thereafter, the sheets 12 and 14 are placed in contact with the ridges 18 as illustrated in FIG. 1 to produce maximum thermal conductivity between the sheets 12 and 14 and the sheet 16. The side walls (not illustrated) are attached to the plates 12 and 14 to produce a fluid-tight seal by a process such as, but not limited to, brazing.

FIG. 4 illustrates an enlarged view of the heat exchanger of FIG. 1. The enlarged view of FIG. 4 illustrates a heat source 24 in contact with the second panel 14 for transmitting heat from the heat source 24 through the thermally conductive panel 14 to the fluid flowing through the core as indicated by the arrows from right to left. As is illustrated by the fluid flow arrows, the apertures 32 form jets which impinge upon the second panel 14 to produce jet impingement cooling of the panel 14 which is thermally coupled to the heat source 24. After the fluid jets contact the second panel 14, the fluid flows through the rectangular aperture 34 toward another section 22. The second panel 14 has a higher heat dissipation capability than the first plate 12 as a consequence of the jets of fluid impinging directly only on the second panel which are produced by passage through the apertures 32. Each ridge 18 is formed by the intersection of two sections 22 and has an axis which is perpendicular to the direction of fluid flow through the core. The two sections 22 which form a ridge 18 face either the first plate 12 or the second plate 14. An angle measured between the section 22 having the apertures 32 and the axis of fluid flow is less than an angle measured between the section 22 having the aperture 34 and the axis of fluid flow. The corrugations of FIG. 4 having each of the ridges 18 are in the configuration of sawtooth.

FIG. 5 illustrates an enlarged view of the heat exchanger of FIG. 1 in which the fluid flow direction along the axis of fluid flow is reversed from that illustrated in FIG. 4. As a consequence, the first plate 12 has a higher heat dissipation capability than the second plate 14 which is the reason why the heat source 24 contacts the first panel. The difference between the heat exchange operation of FIG. 4 and FIG. 5 is that the apertures 32 form jets which impinge upon the first plate 12 as illustrated in FIG. 5 instead of the second plate 14 as illustrated in FIG. 4.

FIG. 6 illustrates an enlarged view of a heat exchanger of FIG. 1 utilizing the sheet of the bottom section 33 of FIG. 2 formed into a corrugated plate as in FIG. 1 in which the apertures 38 take the place of the single aperture 34 of the heat exchanger illustrated in FIGS. 4 and 5. As is apparent, the flow of fluid toward another section 22 is produced by the apertures 38 instead of the single aperture 34 in FIGS. 4 and 5. Otherwise, operation is identical to FIGS. 4 and 5 with the direction of fluid flow as respectively illustrated in FIGS. 4 and 5 determining which of the two plates 12 and 14 is the plate having the higher heat dissipation capability. It should be noted that the heat source 24 has been omitted from FIG. 6 for purposes of simplification of the drawings.

While the preferred materials from which the first and second plates 12 and 14 and the heat conductive sheet 16 are manufactured are metals such as copper and aluminum which have a high heat conductivity, are easily workable and may be brazed during assembly of the heat exchanger into a fluid-tight structure including suitable inlet and outlet manifolds which have not been described as a consequence of these structures being conventional, it should be understood that non-metallic heat conductive materials may be used in the practice of the invention. Furthermore, the present invention is not limited to any particular size of apertures but, in practice, the apertures 32 and 38 may range in diameter from 0.015 to 0.050 inches. Furthermore, the ridges 18 which are formed by the corrugation of the sheet 30 of FIG. 2 may repeat at approximately twenty ridges (fins) per inch. Various types of electronics functioning as heat dissipating devices 24 may be mounted to the first and second plates 12 and 14. The overall heat dissipating capability of the plates 12 and 14 on which the jets of fluid impinge is in the order of 50% of the high performance CHIC jet impingement heat exchangers described with reference to the prior art. This cooling capability permits sufficient cooling of electronics to provide long life and further has the benefits of low cost and ease of manufacturing when compared to the prior art heat exchangers formed from multiple sheets in a core to produce jet impingement cooling.

While the invention has been described in terms of its preferred embodiments, it should be understood that numerous modifications may be made thereto without departing from the spirit and scope of the invention as defined in the appended claims. It is intended that all such modifications fall within the scope of the appended claims.

We claim:

1. A heat exchanger comprising:
   first and second heat conductive spaced apart plates;
   a heat conductive sheet disposed between the plates and having repeating ridges in thermal contact with the plates with successive ridges facing a different one of the plates; and
   sections of the sheet disposed between successive ridges being inclined with respect to the axis of fluid flow and containing at least one aperture with the at least one aperture between opposed surfaces of the section passing fluid flow through the at least one aperture when fluid flows along the axis of fluid flow and with fluid flow through the at least one aperture of a plurality of the sections producing jets of fluid contacting one of the plates.

2. A heat exchanger in accordance with claim 1 wherein:
   first and second sections form a ridge facing the first plate with the first section having at least one aperture through which fluid flows and is directed in at least one jet to contact the first plate which is to be thermally coupled to a heat source for transmitting heat flowing from the heat source to the first plate to the flowing fluid and the second section having at least one aperture through which fluid flows to another first section and is directed to flow toward the another first section with the first plate during fluid flow having a higher heat dissipation capability than the second plate.

3. A heat exchanger in accordance with claim 2 wherein:
   the first section contains a plurality of apertures.

4. A heat exchanger in accordance with claim 3 wherein:
   the second section contains a single aperture having a cross-sectional area larger than a cross-sectional area of individual apertures in the first section.

5. A heat exchanger in accordance with claim 3 wherein:
   the second section contains a plurality of apertures.

6. A heat exchanger in accordance with claim 4 wherein:
   the single aperture is rectangular in cross section and has a longitudinal dimension perpendicular to the axis of fluid flow.

7. A heat exchanger in accordance with claim 2 wherein:
   an angle measured between the first section and the axis of fluid flow is less than an angle measured between the second section and the axis of fluid flow.

8. A heat exchanger in accordance with claim 3 wherein:
   an angle measured between the first section and the axis of fluid flow is less than an angle measured between the second section and the axis of fluid flow.

9. A heat exchanger in accordance with claim 4 wherein:
   an angle measured between the first section and the axis of fluid flow is less than an angle measured between the second section and the axis of fluid flow.

10. A heat exchanger in accordance with claim 5 wherein:
    an angle measured between the first section and the axis of fluid flow is less than an angle measured between the second section and the axis of fluid flow.

11. A heat exchanger in accordance with claim 6 wherein:
    an angle measured between the first section and the axis of fluid flow is less than an angle measured between the second section and the axis of fluid flow.

12. A heat exchanger in accordance with claim 2 wherein:
    the second section and the another first section form a ridge facing the second plate.

13. A heat exchanger in accordance with claim 3 wherein:
    the second section and the another first section form a ridge facing the second plate.

14. A heat exchanger in accordance with claim 4 wherein:
    the second section and the another first section form a ridge facing the second plate.

15. A heat exchanger in accordance with claim 5 wherein:
    the second section and the another first section form a ridge facing the second plate.

16. A heat exchanger in accordance with claim 6 wherein:
    the second section and the another first section form a ridge facing the second plate.

17. A heat exchanger in accordance with claim 7 wherein:
    the second section and the another first section form a ridge facing the second plate.

18. A heat exchanger in accordance with claim 1 wherein:
    the sheet is metallic and corrugated and the plates are metallic.

19. A heat exchanger comprising:
    first and second heat conductive spaced apart plates with one of the plates being selectible to exchange more heat than the other of the plates with fluid flowing through the heat exchanger by choosing a direction of fluid flow through the exchanger;
    a heat conductive sheet disposed between the plates and having repeating ridges in thermal contact with the plates with successive ridges facing a different one of the plates and sections of the sheet between successive ridges being inclined with respect to the axis of fluid flow and containing at least one aperture with the at least one aperture extending between opposed surfaces of the section for passing fluid flow through the at least one aperture when fluid flows along the axis of fluid flow with fluid flow through the at least one aperture of a plurality of sections producing jets of fluid contacting one of the plates; and means for controlling the direction of fluid flow along the fluid flow axis in a first direction or a second direction opposite to the first direction to select which of the first and second plates exchanges more heat.

20. A heat exchanger in accordance with claim 19 wherein:

first and second sections form a ridge facing one of the plates with a first section having at least one aperture through which fluid flows and is directed in at least one jet to contact the one plate and the second section having at least one aperture through which fluid flows to another first section and is directed to flow toward the another first section.

21. A heat exchanger in accordance with claim 20 wherein:

the first section contains a plurality of apertures.

22. A heat exchanger in accordance with claim 21 wherein:

the second section contains a single aperture having a cross-sectional area larger than a cross-sectional area of the plurality of apertures in the first section.

23. A heat exchanger in accordance with claim 20 wherein:

the second section contains a plurality of apertures.

24. A heat exchanger in accordance with claim 22 wherein:

the single aperture is rectangular in cross section and has a longitudinal dimension perpendicular to the axis of fluid flow.

25. A heat exchanger in accordance with claim 20 wherein:

an angle measured between the first section and the axis of fluid flow is less than an angle measured between the second section and the axis of fluid flow.

26. A heat exchanger in accordance with claim 20 wherein:

. the second section and the another first section form a ridge facing another one of the plates.

27. A heat exchanger in accordance with claim 1 wherein:

the sheet is metallic and corrugated and the plates are metallic.

* * * * *